United States Patent [19]

Kage

[11] 4,204,170
[45] May 20, 1980

[54] IMPULSE NOISE LIMITER CIRCUIT

[75] Inventor: Kouzou Kage, Tokyo, Japan

[73] Assignee: Nippon Electric Co., Ltd., Tokyo, Japan

[21] Appl. No.: 867,410

[22] Filed: Jan. 6, 1978

[30] Foreign Application Priority Data

Jan. 7, 1977 [JP] Japan .................................. 52-1042

[51] Int. Cl.² .......................... H03K 1/10; H03K 5/08
[52] U.S. Cl. .................................. 328/165; 328/162; 328/171; 307/237
[58] Field of Search ............... 328/171, 162, 165, 169; 307/237

[56] References Cited

U.S. PATENT DOCUMENTS

| | | | |
|---|---|---|---|
| 2,497,693 | 2/1950 | Shea | 328/171 X |
| 3,524,081 | 8/1970 | Campanella | 328/171 X |
| 3,755,750 | 8/1973 | Heberling | 328/171 |

Primary Examiner—John S. Heyman
Attorney, Agent, or Firm—Sughrue, Rothwell, Mion, Zinn and Macpeak

[57] ABSTRACT

An impulse noise limiter circuit comprises a delay circuit for delaying a signal containing impulse noise and a clamp circuit provided between the input and output terminals of the delay circuit for limiting the voltage difference between the terminals to a given value.

2 Claims, 14 Drawing Figures

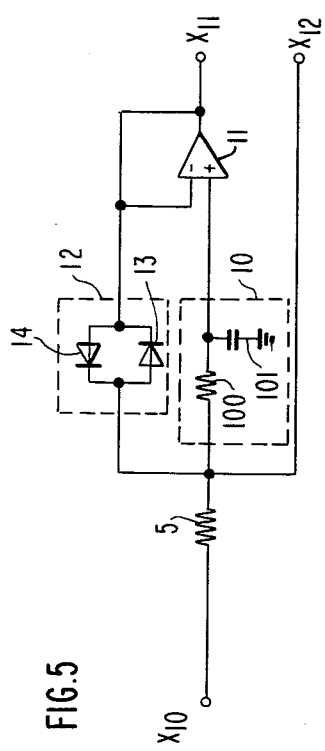
FIG.5
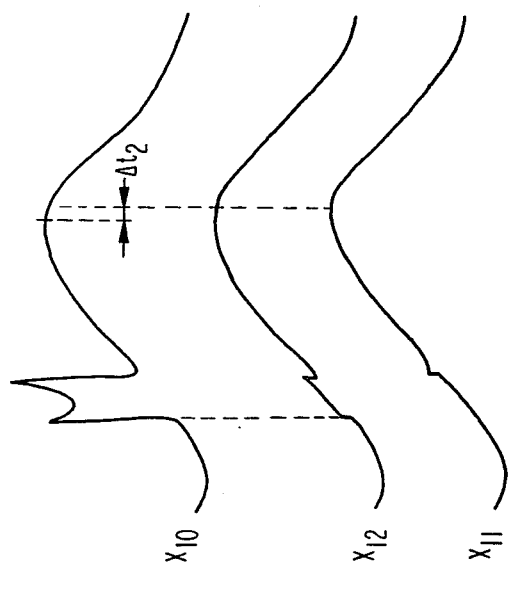
FIG.6a
FIG.6b
FIG.6c
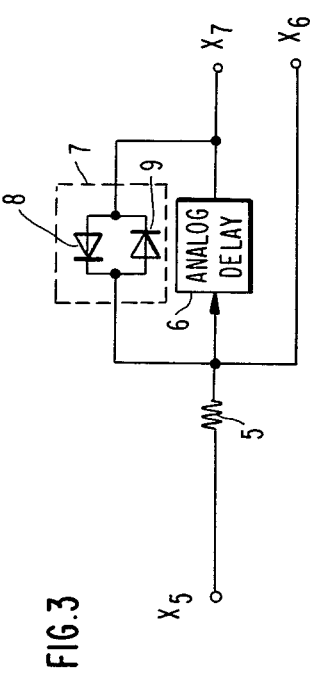
FIG.3
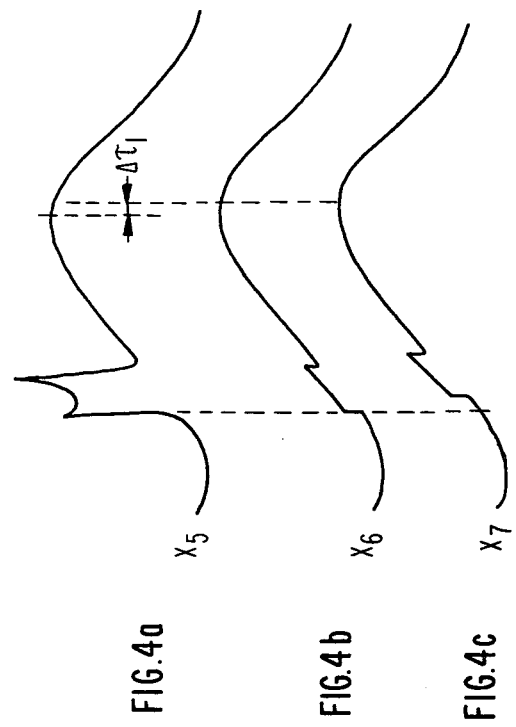
FIG.4a
FIG.4b
FIG.4c

IMPULSE NOISE LIMITER CIRCUIT

BACKGROUND OF THE INVENTION

The present invention relates to an impulse noise limiter circuit for limiting impulse noise contained in a signal.

One of the conventional methods for removing impulse noise employs a low pass filter to allow only the signal to pass therethrough while removing the noise. Another example of the conventional methods extracts the impulse noise by means of a high pass filter, and inverts the extracted impulse noise and applies it to the signal containing the impulse noise so that the noise component may be cancelled. The residual noise component may further be removed by the use of a low-pass filter.

However, with the former method, the impulse noise can not be removed sufficiently. Even in the latter method, it is difficult to perfectly remove the impulse noise. A modification of these conventional methods is disclosed in U.S. Pat. No. 3,810,067 issued on May 7, 1974. However, the modification is complicated in construction and operation.

SUMMARY OF THE INVENTION

One object of the present invention is to provide an impulse noise limiter circuit that is free from the aforementioned disadvantages.

According to one feature of the present invention, there is provided an impulse noise limiter circuit comprising a delay circuit for delaying a signal containing impulse noise and a clamp circuit provided between input and output terminals of the delay circuit for limiting the voltage difference between the terminals to a given value.

BRIEF DESCRIPTION OF THE DRAWINGS

Now the present invention will be described in greater detail with reference to the accompanying drawings, in which:

FIGS. 2(a) to 2(e) show examples of waveforms at various points in the circuit shown in FIG. 1;

FIG. 3 shows one preferred embodiment of the present invention;

FIGS. 4(a) to 4(c) show waveforms at various points in the circuit shown in FIG. 3;

FIG. 5 shows another preferred embodiment of the present invention; and

FIGS. 6(a) to 6(c) show waveforms at various points in the circuit shown in FIG. 5.

DETAILED DESCRIPTION OF THE DRAWING

Figure 1:
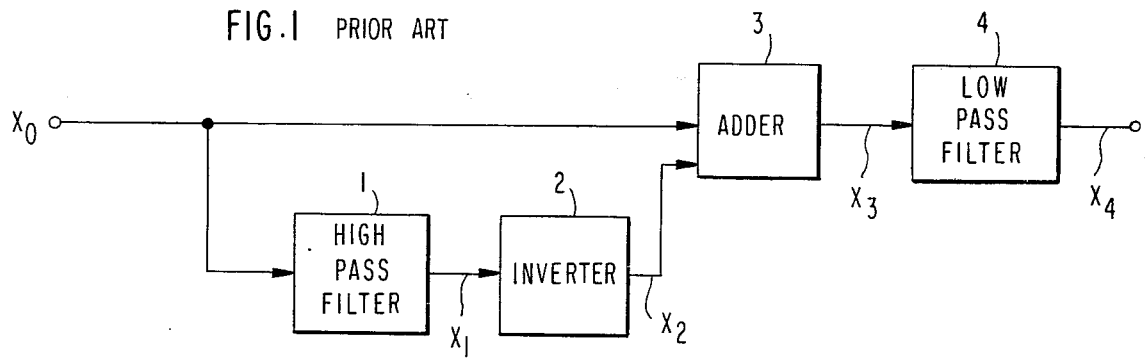
FIG. 1 shows one example of a conventional circuit for removing impulse noise.
Figure 1:
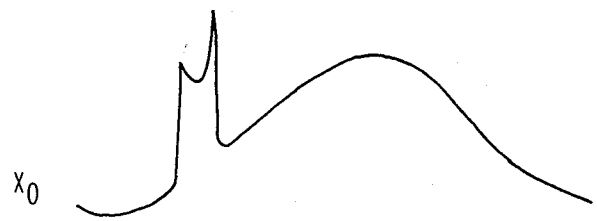
Figure 1:
Figure 1:
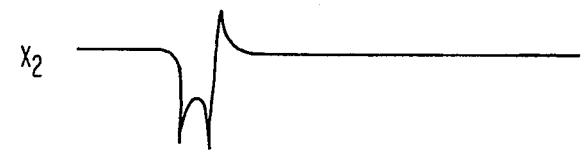
Figure 2D:
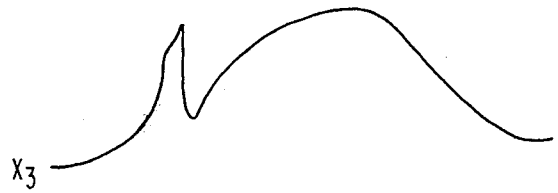
Figure 2E:
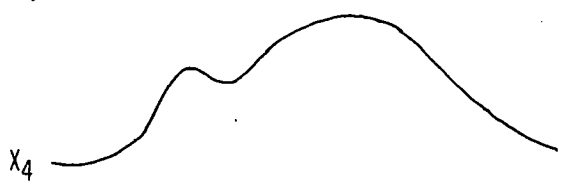

The construction and operation of the conventional circuit shown in FIG. 1 will be described first, referring also to FIGS. 2(a) to 2(e). In FIG. 1, a high-pass filter 1 extracts only an impulse noise component. The cut-off frequency of this filter 1 is selected at a sufficiently high frequency to prevent the signal component from being removed. With such provision the extracted impulse noise $X_1$ as shown in FIG. 2(b) is somewhat different from the impulse noise contained in the input signal $X_0$ as shown in FIG. 2(a). Inverter 2 inverts the extracted impulse noise $X_1$, and the output $X_2$ of this inverter 2 (shown in FIG. 2(c)) and the input signal $X_0$ are added to each other by means of an adder circuit 3 (for example, an operational amplifier). The output $X_3$ of the circuit 3 has residual impulse noise as shown in FIG. 2(d). The waveform $X_3$ is then passed through a low-pass filter 4 for further removing the residual noise component. However, in the output $X_4$ of the filter 4 still remains the effect of the impulse noise as shown in FIG. 2(e). According to this method, the larger the impulse noise, the greater is the effect of the impulse noise at the output $X_4$.

A limiter circuit according to the first preferred embodiment of the present invention is illustrated in FIG. 3, with the waveforms at various points in the circuit shown in FIGS. 4(a) to 4(c) in FIG. 3, a resistor 5 couples an input signal $X_5$ shown in FIG. 4(a) to an analog delay element 6. A non-linear circuit 7 (clamp circuit) comprising diodes is connected between the input and output of the analog delay element 6. When a voltage difference between the input and output of the analog delay element 6 becomes larger than a given value, one of the diodes 8 and 9 turns conductive to cause a current to flow abruptly therethrough, so that the input $X_6$ shown in FIG. 4(b) of the delay element 6 takes a substantially equal value to the output $X_7$ shown in FIG. 4(c). The output signal $X_7$ is delayed in phase relative to the signal $X_5$ by time interval $\Delta\tau_1$ because the signal $X_7$ is an output of the delay element 6. Accordingly, if the signal $X_5$ rises abruptly due to the impulse noise, then at the moment when the signal $X_5$ has risen, the signal $X_7$ is still kept at the state $\Delta\tau_1$ before rising of the signal $X_5$, so that the diode 9 becomes conducting and thus the input $X_6$ of the delay element 6 cannot rise higher than the voltage required for the diode 9 to conduct. Consequently, the signal $X_6$ has its impulse noise suppressed in comparison to the signal $X_5$ as shown in FIG. 4(b). This signal $X_6$ is passed through the delay element 6 and appears at its output as an output signal $X_7$ with a delay of $\Delta\tau_1$ as shown in FIG. 4(c). As will be obvious from the above explanation, however large the impulse noise in the input signal $X_5$ may be, it would not largely effect the signal $X_7$ because the effect upon the signal $X_6$ is limited by the diode 8 or 9.

The second preferred embodiment of the present invention is illustrated in FIG. 5 with the waveforms at various points in the circuit shown in FIGS. 6(a) to 6(c). In FIG. 5, a delay circuit is composed of a low-pass filter 10 consisting of a resistor 100 and a capacitor 101, and a buffer circuit (in the illustrated embodiment, a voltage follower circuit) 11. The input signal $X_{12}$ of the filter 10 is converted into an output signal $X_{11}$ as delayed by time interval $\Delta\tau_2$ and having a high frequency component in the waveform $X_{12}$ removed as shown in FIGS. 6(b) and 6(c). Accordingly, at the moment when the impulse noise has been applied to the input of the limiter circuit resulting in the abrupt rise of the waveform as shown in FIG. 6(a), the output $X_{11}$ is still kept at the state $\Delta\tau_2$ before the abrupt rise, so that a diode 13 turns conductive and thus the input signal of the delay circuit is clamped in the form of the waveform $X_{12}$ as shown in FIG. 6(b). In the embodiment shown in FIG. 5, since the waveform $X_{12}$ is further passed through the filter 10 before it appears as the output $X_{11}$, the effect of the impulse noise becomes very small.

It is to be noted that the diodes 8 and 14 in the circuits shown in FIGS. 3 and 5, respectively, operate in the abovedescribed manner for the impulse noise of the opposite polarity. Furthermore, as the above-described delay circuit, a CCD (Charge Coupled Device) or a BBD (Bucket Brigade Device) can be employed. Furthermore, it is to be noted that the impulse noise limiter circuit according to the present invention can be used as an IDC (Instantaneous Deviation Control) circuit.

As described above, the impulse noise limiter of the present invention in capable of suppressing the adverse effect of the noise to an unharmful level even if it is very large in intensity. What is claimed is:

1. An impulse noise limiter circuit for removing impulse noise contained in a signal, comprising:
    a delay circuit having an input and an output for delaying said signal;
    a voltage follower circuit having an inverting input, a non-inverting input and an output, the output of said delay circuit being connected to said non-inverting input and the output of said voltage follower circuit being coupled to said inverting input; and
    a pair of diodes connected in parallel and in opposite polarity to each other and connected between the input of said delay circuit and the output of said voltage follower circuit, whereby said voltage follower circuit provides isolation between the output of the delay circuit and said pair of diodes.

2. An inpulse noise limiter circuit as claimed in claim 1, wherein said delay circuit comprises a low pass filter.

* * * * *

UNITED STATES PATENT AND TRADEMARK OFFICE
CERTIFICATE OF CORRECTION

PATENT NO. : 4,204,170
DATED : May 20, 1980
INVENTOR(S) : Kouzou KAGE

It is certified that error appears in the above—identified patent and that said Letters Patent is hereby corrected as shown below:

IN THE SPECIFICATION

Column 1, line 55, delete "DRAWING" and insert -- INVENTION --.

Column 2, line 13, after "4(c)" insert -- . -- .

line 13, delete "in" and insert -- In -- .

line 16, after "diodes" insert -- 8 and 9 -- .

line 49, after "11" insert -- provides isolation between the output of the delay circuit and the diodes 13 and 14 -- .

line 66, delete "abovedescribed" and insert -- above-described -- .

UNITED STATES PATENT AND TRADEMARK OFFICE
CERTIFICATE OF CORRECTION

PATENT NO. : 4,204,170
DATED : May 20, 1980
INVENTOR(S) : Kouzou KAGE

It is certified that error appears in the above—identified patent and that said Letters Patent is hereby corrected as shown below:

IN THE CLAIMS

Column 3, line 8, "What is claimed is:" should be on a separate line.

Column 4, line 12, delete "inpulse" and insert -- impulse -- .

Signed and Sealed this

Ninth Day of December 1980

[SEAL]

Attest:

SIDNEY A. DIAMOND

Attesting Officer      Commissioner of Patents and Trademarks